United States Patent [19]

Davis

[11] Patent Number: 4,651,305
[45] Date of Patent: Mar. 17, 1987

[54] SENSE AMPLIFIER BIT LINE ISOLATION SCHEME

[75] Inventor: Harold L. Davis, The Colony, Tex.

[73] Assignee: Thomson Components-Mostek Corporation, Carrollton, Tex.

[21] Appl. No.: 700,571

[22] Filed: Feb. 11, 1985

[51] Int. Cl.⁴ .............................................. G11C 7/00
[52] U.S. Cl. .................................... 365/205; 365/210
[58] Field of Search ............... 365/205, 207, 208, 210, 365/190, 202

[56] References Cited

U.S. PATENT DOCUMENTS

| 4,169,233 | 9/1979 | Haraszti | 365/205 X |
| 4,441,171 | 4/1984 | Hoffmann | 365/205 |
| 4,555,777 | 11/1985 | Poteet | 365/205 |

Primary Examiner—Joseph A. Popek
Attorney, Agent, or Firm—Roland Plottel

[57] ABSTRACT

In a CMOS ROM memory arrangement, the use of the least significant column address bit to perform the dual function of even/odd bit line select and the disconnection of the selected bit line (17' and 17") from the sense amplifier (66) driven, in order to reduce its capacitive load, prior to the time of latching the information into the sense amplifier (66).

5 Claims, 3 Drawing Figures

SENSE AMPLIFIER BIT LINE ISOLATION SCHEME

DESCRIPTION

1. Technical Field

This invention is directed toward the technical field of CMOS ROM devices.

2. Background Art

A basic ROM memory scheme includes a matrix of CMOS transistors arranged between row and column lines. Interspersed between the column lines are so called bit lines. In particular, the bit lines adjacent to a particular column line can be referred to as odd and even bit lines. The row lines in a ROM memory are frequently referred to as word lines when there are enough bit lines associated with a given row line so the memory can address an entire word of information without shifting to another row.

The transistors in the memory array are connected to the word, bit and column lines at their respective gates, drains and sources. By selecting a given row or wordline, all of the gates of the transistors on that row or wordline are enabled. Having identified the row on which the transistor containing information of interest lies, pairs of transistors adjacent to particular column lines can be addressed through decode lines. As is well known, three decode lines can address eight column lines and thus sixteen transistors of the pair. Which of the two transistors is of interest can then be selected by odd or even select lines CA and CA bar operating through pass transistors as will be shown in greater detail below.

If the bit line is not isolated from the sense amplifier while its data is being latched into the sense amplifier, then the sense amplifier sees the capacitance of the entire selected bit line, which slows its translation down considerably. This also causes the bit line to be discharged fully to ground and wastes the precharge power required to bring it completely to the positive supply voltage. If the bit line had been isolated at the time the sense amplifier was latched, it could have remained near the positive supply requiring very little precharging power.

It has been considered possible to add another pass transistor to the arrangement, effective to isolate the bulk of the selected bit line from the sense amplifier at the time of latching, but this additional overhead of another element is considered burdensome and disadvantageous from the perspective of other factors. For example, the addition of another pass transistor consumes additional power and introduces delays in signal movement not otherwise present.

SUMMARY OF THE INVENTION

It is alternatively proposed that instead of adding additional components with their attendant disadvantages, instead to turn off the pertinent even or odd bit select signal line, when the desired data has an opportunity to settle into the sense amplifier. This will occur at the same time the LATCH signal is applied to the sense amplifier.

Therefore, according to the invention herein, the LATCH complement line to the sense amplifier is tapped and combined through logic gates with the corresponding even or odd bit select lines. Thus, when LATCH goes active, the effective odd or even bit select line is disabled, in effect disconnecting and isolating the prior selected bit line from the sense amplifier. This reduces the capacitance on the sense amplifier, speeding its latching operation; it does not place an extra delay in the signal path; and it allows the bit line to remain near the positive supply to reduce precharge power.

DETAILED DESCRIPTION OF THE INVENTION

Figure 1:
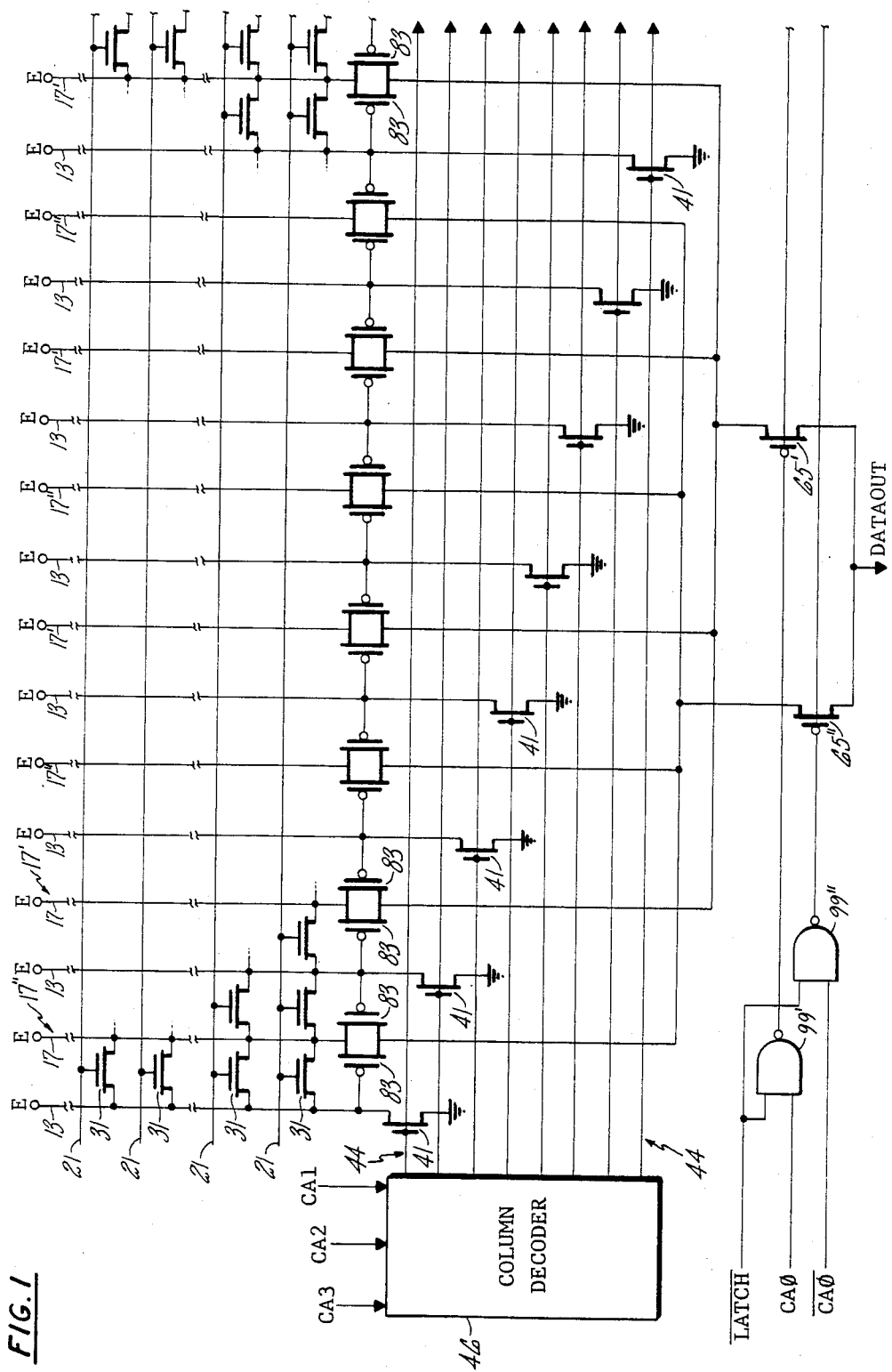
FIG. 1 is a schematic of a portion of a standard CMOS ROM memory device incorporating features of the invention addressed herein.

FIG. 1 shows a portion of a 1Mb ROM chip schematic including a plurality of vertically indicated column lines 13 and adjacent vertically disposed bit lines 17. More specifically, the arrangement calls for repetitively alternating bit and column lines 17 and 13. In effect, each column line 13 is straddled by a pair of adjacent bit lines 17, which can for convenience be called the odd and even bit lines 17' and 17".

The scheme of the ROM memory chip additionally includes a plurality of horizontally indicated row or word lines 21. In the Figure shown, according to a typically used ROM configuration, there are 1024 wordlines 21. The actual memory cells of the ROM, each of them including a single transistor 31 of the field effect kind, are systematically arranged in this matrix of bit, column and row or wordlines.

Each of transistors 31 in this arrangement has a gate connnected to a corresponding one of the word lines 21. Accordingly, to access memory and more particularly to access a particular one of the transistors 31 in memory, one has to specify the wordline 21 on which it lies. This is done by applying a predetermined voltage level onto the particular wordline 21.

Each of the memory cell transistors 31 has its drain connected to an adjacent column line 13. Each of the column lines 13 is connected to ground through an associate column pull-down transistor 41, which is controlled by lines 44 from a column decoder 46, and through which the voltage level of the column line is pulled to ground. This can draw current from each of the adjacent memory transistors 31 on the sides of the column line 13 provided the particular wordline 21 has been activated.

Additionally, by activating a column line 13, the adjacent bit lines 17, are applied to even and odd bit line select transistors 65 controlled by even or odd bit line select signals CA and CA complement. These signals are derived from the last significant column address bit. Further, the discharge of the column line 13 turns on pass transistors 83 to allow current flow, permitting the memory contents to be applied to transistors 65.

Figure 2:
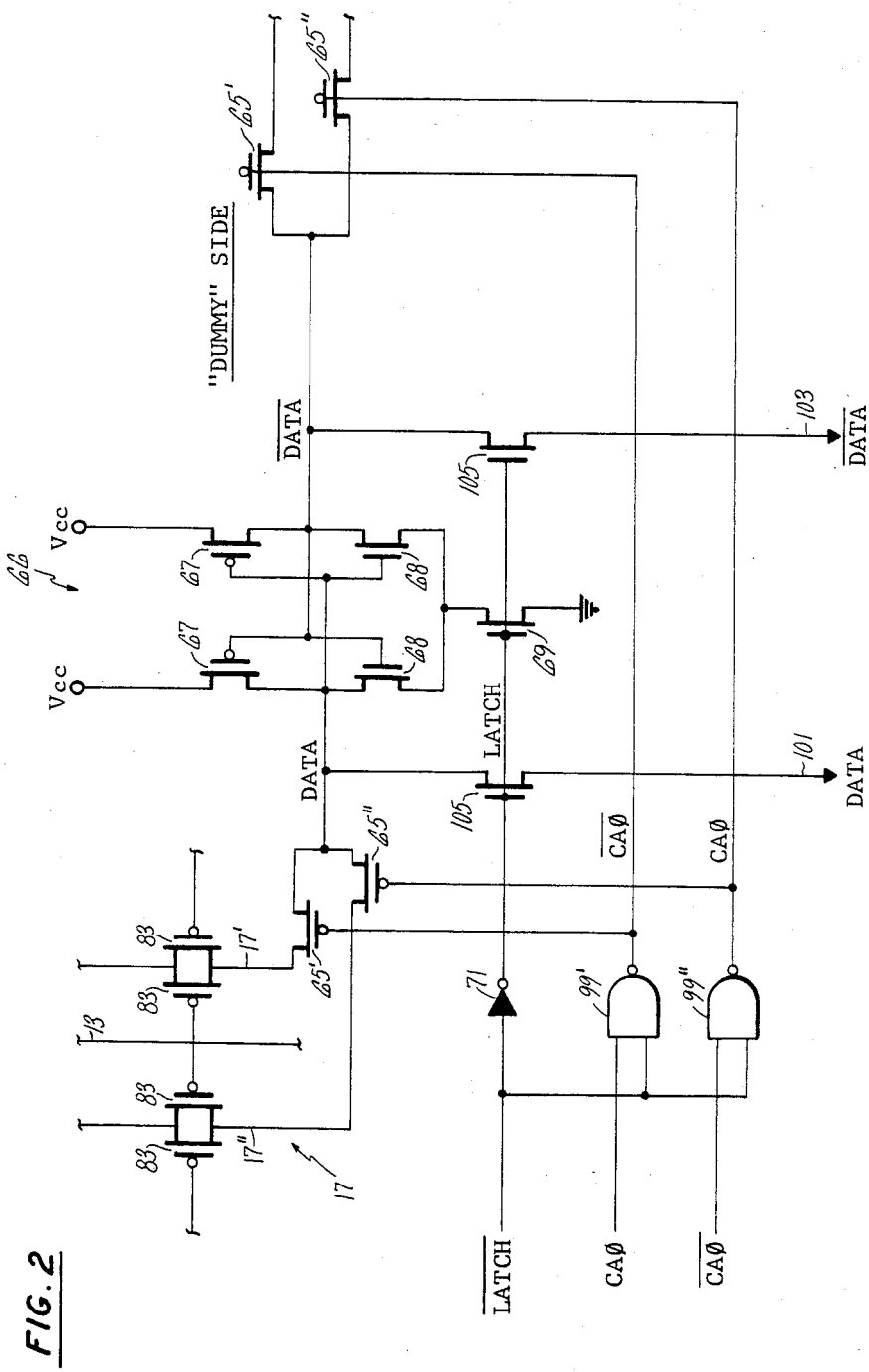
FIG. 2 shows the sense amplifier driven by the memory portions of the ROM indicated in FIG. 1.

These signals select which of the two bit lines 17' and 17" is actually permitted to deposit information onto the sense amplifier 66 shown in FIG. 2.

FIG. 2 shows sense amplifier 66 comprising symmetrical pairs of p-channel transistors 67 connected to Vcc and n-channel transistors 68 connected to latching transistor 69 driven by a LATCH signal produced through inversion at inverter 71 from a prior-created LATCH signal. The Figure additionally shows bit and column lines 17 and 13, with information being passed on a selected one of bit lines 17' or 17" through a selected one of pass transistors 83. Then odd or even bit select signals CAO and CAO complement select one or the other of bit lines 17' and 17" by action of pass transistors 65. Thus, one of the bit lines 17' or 17" places data on the DATA line which is connected to the inputs of sense amplifier 66. A symmetrical construction of sense amplifier 66 is apparent in FIG. 2, as DATA inputs from both the primary and dummy side of the chip are accepted.

The dummy side pass transistors 65 operate analogously to those on the regular or primary side already discussed, being driven by CAO and CAO complement signals as suggested above with respect to the primary side.

Output signals from pass transistor 65 are taken along DATA and DATA complement lines 101 and 103, as shown. These are controlled by pass transistors 105 driven by the LATCH signal.

In addition to the arrangement shown in FIG. 1, there is an additional mirror image arrangement of circuitry essentially the same as that in FIG. 1, but serving to place dummy data in comparison with actual data which is also applied to the same sense amplifier.

Figure 3:
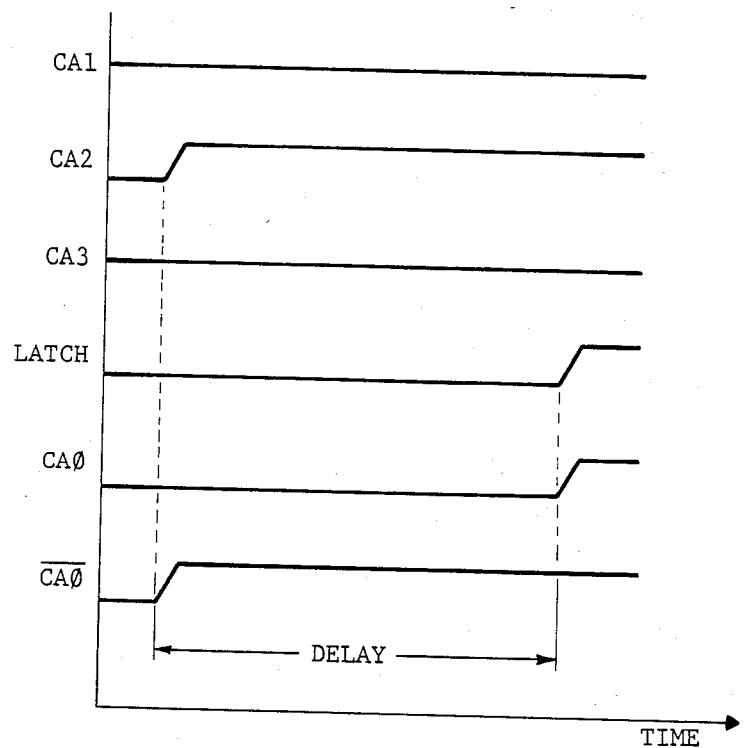
FIG. 3 is a timing diagram showing an example of the interaction between column decode signals, even or odd bit select line signals and the LATCH signal to the sense amplifier of FIG. 2.

FIG. 3 is a timing diagram showing the application sequence of memory information to the sense amplifier 66. In particular, at the beginning of a memory cycle, the address of the transistor to be accessed is read, then the decoder is activated, the information is applied to the sense amplifer and settles there. Then, after a delay long enough to allow adequate differential signal to develop on the sense amplifier, the LATCH signal switches, isolating the selected bit lines from sense amplifier and also latching the sense amplifier. This effectively speeds up the response time of the sense amplifier by a considerable amount.

More particularly, FIG. 3 shows the decoder address signals CA1 and CA2 and combinations of high and low states the individual signals can produce. In beginning thereof; and CA3 stays low during the entire evolution as well. As a column line for example can be addressed or enabled to the exclusion of all other column lines 13.

FIG. 3 further shows LATCH signal going high near the end of the memory address cycle after an appropriate delay sufficient for the information in the selected bit line 17 to settle on sense amplifier 66. The latch signal controls the rise of the final two signals shown in FIG. 3, namely CA and CA complement. This control is exercised through two NAND gates 99 as shown in FIG. 2.

Persons skilled in the art may read the above and as a consequence thereof conceive of variations of the invention, which nonetheless fall within its scope. Accordingly, reference to the claims which follow is strongly urged.

What is claimed is:

1. A memory circuit arrangement comprising
a plurality of memory cells (31);
sense amplifier means (66) for receiving information from said memory cells (31);
means (71) providing a latching signal in one of two states;
said sense amplifier means (66) latching output information in response to said latching signal means,
a plurality of alternating odd (17') and even (17") bit lines transmitting information from said memory cells (31) to said sense amplifier means; and
bit line select means (99, 65) selecting which of said odd (17') and even (17") bit lines is in an ON state at a particular time and therefore connects a respective memory cell (31) with said sense amplifier means (66);
wherein, in accordance with the invention,
said bit line select means (99, 65) comprises first (99') and second (99") gate means for switching between high and low states and pass means (65',65") responsive to said high and low states for controlling respective bit lines (17',17") into one of a selected, ON state, and a de-selected, OFF state,
said gate means (99',99") both being controlled by the state of said latching signal, one of said gate means being effective to terminate the ON state of the selected one of said bit lines (17',17") whereby said bit line select means serves the dual functions of even/odd bit line selection and disconnection of the selected bit line from the sense amplifier prior to latching of said information into said sense amplifier.

2. The memory circuit arrangement of claim 1, further characterized in that
each of said gate means (99',99") is a NAND gate.

3. The memory circuit arrangement of claim 1, further characterized in that
said sense amplifier means (66) receives information at first and second input sides.

4. The memory circuit arrangment of claim 1, further characterized in that
each of said gate means (99',99") has an input which receives a LATCH complement signal.

5. The memory circuit arrangment of claim 1, further characterized in that
said first gate means (99') has an input which receives a first bit select signal (CAO) and
said second gate means (99") has an input which receives the complement of said first bit select signal.

* * * * *